(12) United States Patent
Fang et al.

(10) Patent No.: US 6,514,830 B1
(45) Date of Patent: Feb. 4, 2003

(54) METHOD OF MANUFACTURING HIGH VOLTAGE TRANSISTOR WITH MODIFIED FIELD IMPLANT MASK

(75) Inventors: Hao Fang, Cupertino, CA (US); Narbeh Derhacobian, Belmont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/044,510

(22) Filed: Jan. 11, 2002

Related U.S. Application Data (62) Division of application No. 09/533,057, filed on Mar. 22, 2000, now Pat. No. 6,351,017.

(51) Int. Cl.⁷ .............................................. H01L 21/336
(52) U.S. Cl. ..................... 438/302; 438/289; 438/290; 257/314; 257/369
(58) Field of Search .................................. 438/369, 370, 438/423, 480, 506, 514, 766, 302

(56) References Cited

U.S. PATENT DOCUMENTS

| | | | |
|---|---|---|---|
| 5,789,269 A | 8/1998 | Mehta et al. | |
| 5,861,338 A | 1/1999 | Hu | 438/450 |
| 6,143,612 A | * 11/2000 | Derhacobian et al. | 438/289 |

* cited by examiner

*Primary Examiner*—David Nelms
*Assistant Examiner*—Dung A Le
(74) *Attorney, Agent, or Firm*—Skjerven Morrill LLP (57) ABSTRACT

A method of manufacturing a high voltage transistor exhibiting high gated diode breakdown voltage, low leakage and low body effect while avoiding an excessive number of costly masking steps. A high gated diode breakdown voltage is provided in the manufacturing process by masking the high voltage junctions from the conventional field implant and masking the source/drain regions from the conventional threshold adjust implant. Angled openings are formed in the field implant blocking mask so that the field implant at varying distances away from the junctions, thus achieving low leakage and a high gated diode breakdown voltage. The field implant blocking mask is extended over the channel area, thereby producing a transistor with low body effect.

10 Claims, 6 Drawing Sheets

METHOD OF MANUFACTURING HIGH VOLTAGE TRANSISTOR WITH MODIFIED FIELD IMPLANT MASK

CROSS REFERENCE TO RELATED APPLICATION

This application is a divisional of U.S. patent application Ser. No. 09/533,057, filed Mar. 22, 2000, now U.S. Pat. No. 6,351,017 entitled "High Voltage Transitor With Modified Field Implant Mask".

FIELD OF THE INVENTION

The present invention relates to a method of manufacturing a high-voltage transistor on a semiconductor substrate. The present invention has particular applicability, in manufacturing nonvolatile semiconductor memory devices requiring a high programming voltage.

BACKGROUND

Conventional nonvolatile semiconductor memories, such as flash electrically erasable programmable read only memories (Flash EEPROMs), typically comprise a floating gate memory cell, which includes a source region, a drain region and a channel region formed in a semiconductor substrate, and a floating gate formed above the substrate between the channel region and a control gate. A voltage differential is created in the cell when a high voltage, such as about 18 volts, is applied to the control gate while the channel region is kept at a low voltage. This voltage difference causes electrons to move from the channel region to the floating gate through a phenomenon known as tunneling, thus charging the floating gate. This movement of electrons is referred to as programming, and the high voltage (i.e., about 18 volts) applied to the control gate is known as the program voltage.

Flash memory systems conventionally comprise a two-dimensional array of floating gate memory cells. The array typically includes several strings, known as NAND strings, of floating gate memory transistors, each transistor coupled to the next transistor in the string by coupling the source of one device to the drain of the next device to form bit lines. A plurality of word lines, perpendicular to the NAND strings, each connect to the control gate of one memory cell of each NAND string.

To supply a program voltage on demand to each of the word lines, a CMOS transistor referred to as a "row selector" is employed at one end of each word line. This row-selecting transistor must be able to handle voltages of about 20 volts or higher. Additionally, in order to attain an acceptable level of performance and reliability, it must exhibit high gated diode breakdown voltage characteristics to avoid junction breakdown, low leakage from drain to source, and a low body effect so that its threshold voltage is not excessively high. Conventional processing techniques require many separate photolithographic masking steps to manufacture this transistor. The large number of masking steps raises the production cost of the Flash memory device and increases the probability of defects in the finished device.

There exists a need for simplified methodology in manufacturing a high voltage, high performance transistor with fewer processing steps, thereby reducing manufacturing costs and increasing production throughput.

SUMMARY

An advantage of the present invention is a simplified method of manufacturing a high voltage transistor with a modified field implant blocking mask such that the transistor exhibits high gated diode breakdown voltage, low leakage and low body effect.

According to the present invention, the foregoing and other advantages are achieved in part by a method of manufacturing a semiconductor device, which method comprises isolating an active area on a main surface of a semiconductor substrate, the active area comprising a first junction between a first source/drain region and a channel region and a second junction between a second source/drain region and the channel region, where the channel region has a predetermined width and separates the first source/drain region and the second source/drain region. The channel region has opposing ends that are not abutting either of the source/drain regions. A field implant blocking mask is provided over the first source/drain region and over the channel region. The field implant blocking mask has a pair of angled notches at the opposing ends of the channel region. The angled notches extend towards the center of the channel region such that the ends of the notches are a predetermined distance from the opposing ends of the channel region. The angled notches are angled with respect to the first junction between the first source/drain region and the channel region. Thus, the angled notches form a first distance between the first junction at the opposing ends of the channel region and a second distance between the first junction and the ends of the angled notches. The second distance is greater than the first distance. Inpurities forming the field implant are then implanted into the substrate. The field implant blocking mask can also extend over the second source/drain region with the angled notches forming a first distance between the second junction at the opposing ends of the channel region and a second distance between the second junction and the ends of the angled notches.

Thus, a semiconductor devices if formed with an active region, including the first source/drain region, the second source/drain region, with the channel region therebetween, with a field implant region that surrounds the first source/drain region and the channel region and extends into the channel region from the opposing ends. The field implant extensions extend into the channel region a predetermined distance to form the ends of the extensions. The field implant extensions are angled relative to the junction between the first source/drain region and the channel region. Thus, the semiconductor device has a field implant extension into the channel region that has a first distance from the junction at the opposing ends of the channel region and has a second distance from the junction at the ends of the extensions. The field implant may surround the second source/drain region with the field implant extensions being angled relative to the junction between the second source/drain region and the channel region.

BRIEF DESCRIPTION OF THE DRAWINGS

Reference is made to the attached drawings, wherein elements having the same reference numeral designations represent like elements throughout.

DESCRIPTION OF THE INVENTION

Conventional methodologies for manufacturing high voltage transistors with a high gated diode breakdown voltage, low leakage and low body effect employ a large number of photoresist masking steps, which increases the cost of the finished device and reduces manufacturing yield. The present invention addresses and solves these problems stemming front conventional complex manufacturing processes.

In typical CMOS transistor manufacturing processes, active regions where source/drain and channel areas are to be formed are electrically isolated by the formation of a field oxide at the surface of a semiconductor substrate, and implantation of the substrate under the field oxide with impurities, such as boron. As used throughout the present disclosure and claims, the term "substrate" denotes a semiconductor substrate or an epitaxial layer formed on the semiconductor substrate. The isolated active regions are subdivided into source/drain and channel areas by further implantation of impurities. A gate oxide layer is then formed, followed by a threshold implant, such as p-type boron, through the gate oxide into the substrate to adjust the turn-on characteristics of the devices. After formation of gates above the channel regions, further implants are performed into the source/drain areas, such as a lightly-doped drain (LDD) implant followed by a relatively heavy n+ implant, such as arsenic at a dosage of $1 \times 10^{15}$ atoms $cm^{-2}$.

One method of manufacturing high voltage transistors with a high gated diode breakdown voltage, low leakage and low body effect is described in U.S. Ser. No. 09/172,090, filed on Oct. 14, 1998, entitled "High Voltage Transistor With High Gated Diode Breakdown, Low Body Effect and Low Leakage," and having the same assignee, which is incorporated herein by reference. In U.S. Ser. No. 09/172, 090, a field implant blocking mask 14 with substantially rectangular notches 15, shown in FIG. 1, is used to avoid unnecessary implantation of p-type impurities into the high voltage junction or junctions.

Figure 1:
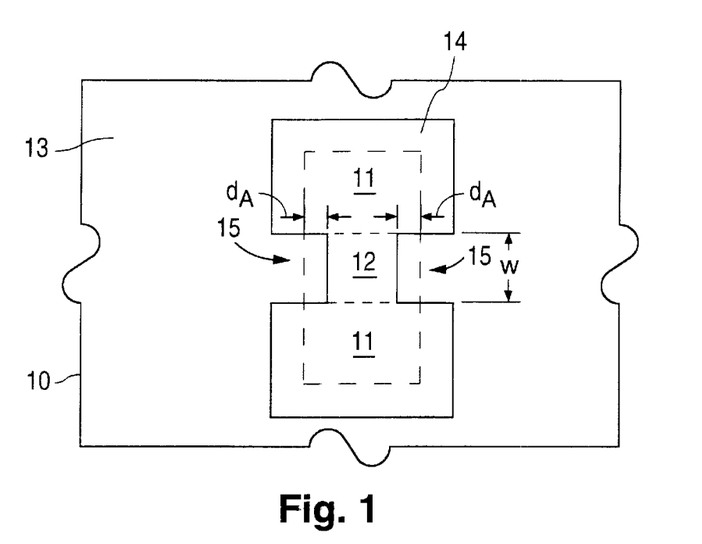
FIG. 1 is a top view of a phase of a method of using a field implant blocking mask with rectangular notches extending over the channel region.

As shown in FIG. 1, substrate 10 has a substantially planar surface and has "active areas" shown as source/drain regions 11 and channel region 12, surrounded by a field oxide 13 grown, e.g, by Local Oxidation of Silicon (LOCOS) by heating the substrate 10 while its unprotected regions are exposed to an oxidizing gas, such as oxygen.

The photoresist field implant blocking mask 14 is formed over the source/drain regions 11 and over channel region 12. However, a pair of substantially rectangular notches 15, each of which has a width w substantially equal to the width of channel region 12, extends towards the center of the channel region 12 a distance $d_A$ from an end of the channel region 12 which does not abut either source/drain region 11.

Impurities may then be implanted into field oxide 13 and channel region 12 to form the field implant region. The impurity implantation enhances the high-voltage transistor's field isolation and reduces leakage at the edges of source/drain regions 11 where they border channel region 12. The transistor's gated diode breakdown voltage is raised by blocking the field implant region from source/drain regions 11 with mask 14, and its body effect is reduced by blocking the field implant region from most of channel region 12 with mask 14.

According to the methodology of the present invention, a high voltage CMOS transistor, such as an n-channel transistor, with a high gated diode breakdown voltage, low leakage and low body effect is formed by lightly doping the junction or junctions of the transistor which are required to handle high voltage (hereinafter referred to as the high voltage junctions) with an n-type impurity, while avoiding unnecessary implantation of p-type impurities into the source/drain regions and pulling the implantation of p-type impurities away from the high voltage junctions under the gate, using a minimum number of masking steps.

Figure 2A:
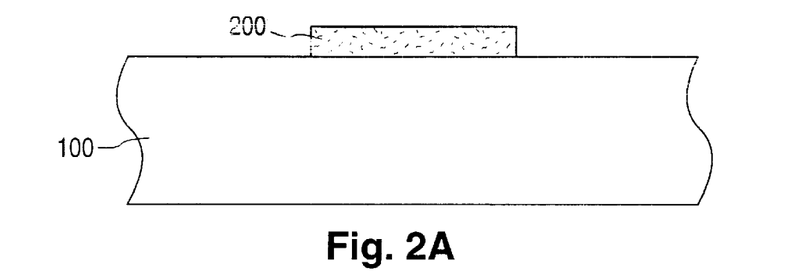
FIGS. 2A–2B are a cross-sectional view and a top view, respectively, of a phase of a method in accordance with an embodiment of the present invention.
Figure 2B:
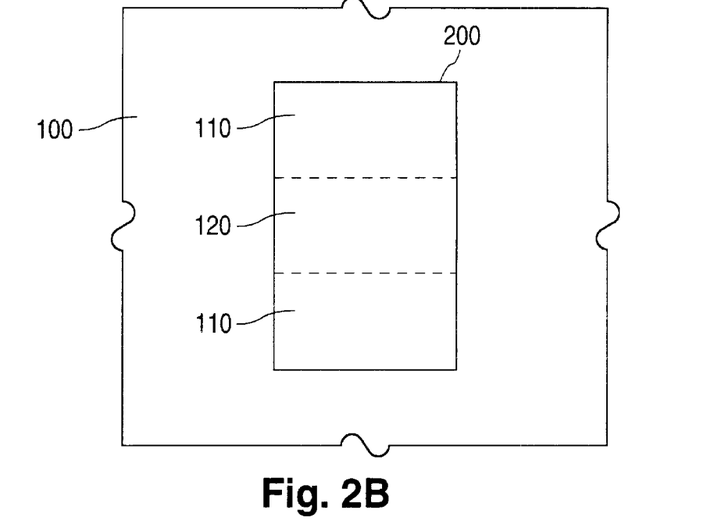
Figure 3:
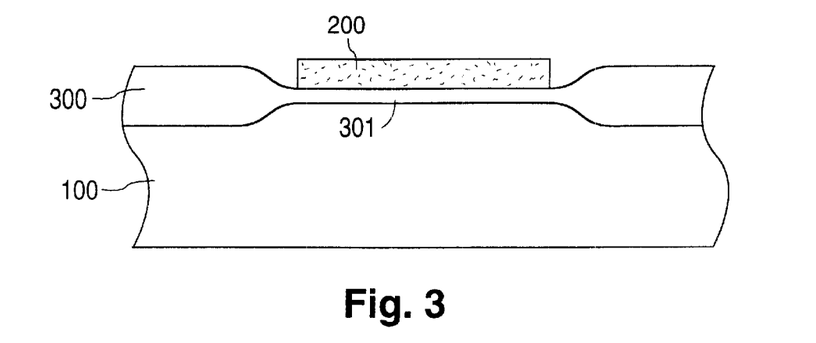
FIG. 3 is a cross-sectional view of a phase of a method in accordance with an embodiment of the present invention.

An embodiment of the present invention is illustrated in FIGS. 2A–10B, wherein sequential phases in forming a semiconductor device in accordance with the present invention are depicted. Referring to FIGS. 2A–2B, substrate 100 is prepared having a substantially planar surface, typically a semiconductor substrate comprising doped monocrystalline silicon or an epitaxial layer formed on a semiconductor substrate in accordance with conventional practices. A photoresist mask 200 is then formed on substrate 100 to protect the areas where device regions are to be formed, called the "active areas". The area shown in FIG. 2B which is protected by mask 200 is substantially rectilinear and comprises source/drain regions 110 separated by a channel region 120, where the source/drain regions and channel of a high voltage transistor are to be formed according to the present invention. A field oxide 300 is grown surrounding the active areas 110, 120, as depicted in FIG. 3, as by Local Oxidation of Silicon (LOCOS) by heating the substrate 100 while its unprotected regions are exposed to an oxidizing gas, such as oxygen. Despite the provision of mask 200, a thin oxide layer 301 grows under mask 200 during the LOCOS process.

As shown in FIGS. 4A through 4D, after removal of mask 200, a photoresist field implant blocking mask 400 is formed over the source/drain regions 110, in accordance with an embodiment of the present invention. For exemplary purposes, the FIGS. show both source/drain areas 110 as high voltage junctions. However, the present method may be practiced even if one of the pair of source/drain areas 110 is a high voltage junction and the other is not (e.g., if one source/drain region 110 will always be grounded), in which case field implant blocking mask 400 would be formed over the area 110 which is to handle high voltage, and not over the other area 110.

Figure 4A:
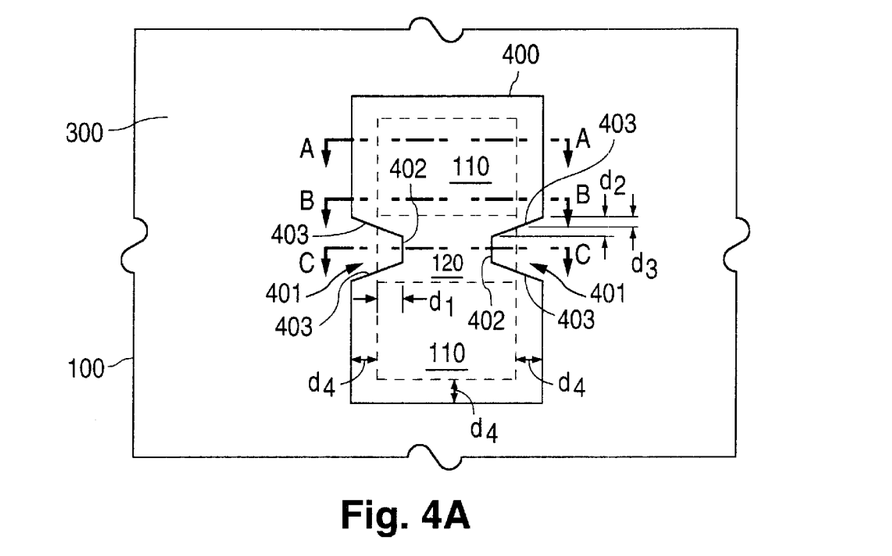
FIG. 4A is a top view of a phase of a method in accordance with an embodiment of the present invention.

Field implant blocking mask 400 includes angled notches 401 over the channel region 120 similar to the field implant blocking mask 14, shown in FIG. 1, however, angled notches 401 in field implant blocking mask 400 are angled such that the field implant is implanted at a varying distance from the high voltage junctions under the gate. Field implant blocking mask 400 extends over channel region 120 with angled notches 401 at the opposing ends of the channel region 120 extending towards the center of the channel region 120. The ends 402 of the angled notches 401 are a distance $d_1$, which may be approximately 0.5 $\mu$m to 100 $\mu$m, from the respective ends of the channel region 120 that do not abut either source/drain region 110, as shown in FIG. 4A. The sides 403 of angled notches 401 are angled relative to the high voltage junctions, i.e., the junctions between source/drain region 110 and channel region 120. Thus, at the ends of the channel region 120, there is a distance $d_2$ between the sides 403 of angled notches 401 and the high voltage junctions, while at the ends 402 of angled notches 401 the sides 403 are a distance $d_3$ from the high voltage junctions. The distance $d_2$ may vary between 0 $\mu$m and approximately 0.6 $\mu$m, while the distance $d_3$ may vary between slightly larger than 0 $\mu$m and approximately 0.6 $\mu$m, however, $d_3$ is greater than $d_2$. Field implant blocking mask 400 preferably extends from the distal end, i.e., the end remote from channel region 120, and the opposing sides of each source/dram area 110 onto field oxide 300 a distance $d_4$, about 0.5 $\mu$m to about 1.0 $\mu$m, preferably about 0.8 $\mu$m. It should be understood, however, that these dimensions may be altered, e.g., via scaling.

Figure 4B:
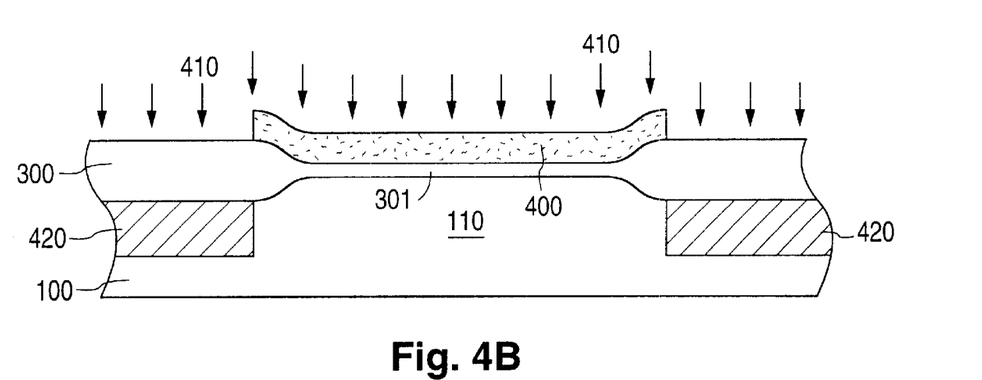
FIG. 4B is a cross-sectional view taken along the line A—A in FIG. 4A.
Figure 4C:
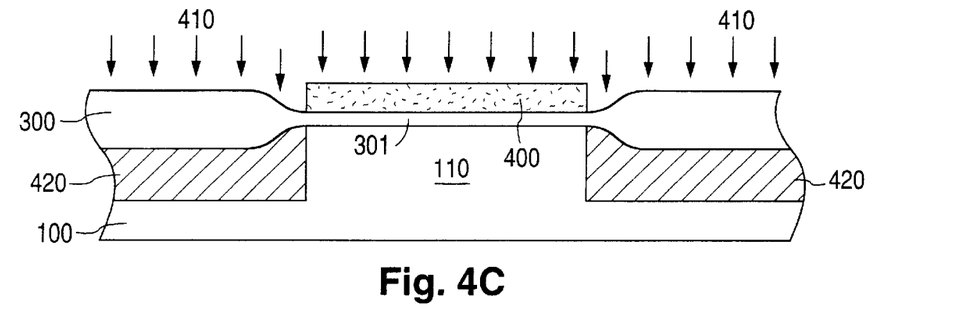
FIG. 4C is a cross-sectional view taken along the line B—B in FIG. 4A.
Figure 4D:
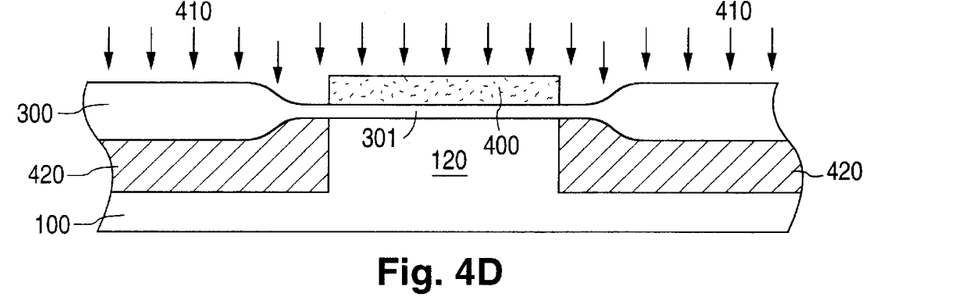
FIG. 4D is a cross-sectional view taken along the line C—C in FIG. 4A.

As shown in FIGS. 4B, 4C, and 4D, which show cross sectional views taken along lines A—A, B—B-, and C—C, respectively, impurities 410 are implanted through field oxide 300, channel region 120, and a portion of source/drain regions 110 to form the field implant 420. The implanted impurities 410, may be, e.g., boron at a dosage of about $1 \times 10^{12}$ Atoms cm$^{-2}$ to about $1 \times 10^{14}$ atoms cm$^2$ and at an energy of about 100 keV to about 200 keV, e.g., at a dosage of about $4.5 \times 10^{12}$ atoms cm$^{-2}$ and at an energy of about 150 keV. This impurity implantation enhances the high-voltage transistor's field isolation and reduces leakage at the edges of source/drain regions 110 where they border channel region 120.

The transistor's gated diode breakdown voltage is raised by blocking field implant 420 from source/drain regions 110 with mask 400, and its body effect is reduced by blocking field implant 420 from most of channel region 120 with mask 400. Because the field implant 420 is further away from the high voltage junction closer to the center of the channel region than at the edge of the channel region, the breakdown characteristics of the transistor are greater than the characteristics produced by field implant blocking mask 14 (FIG. 1).

Figure 5:
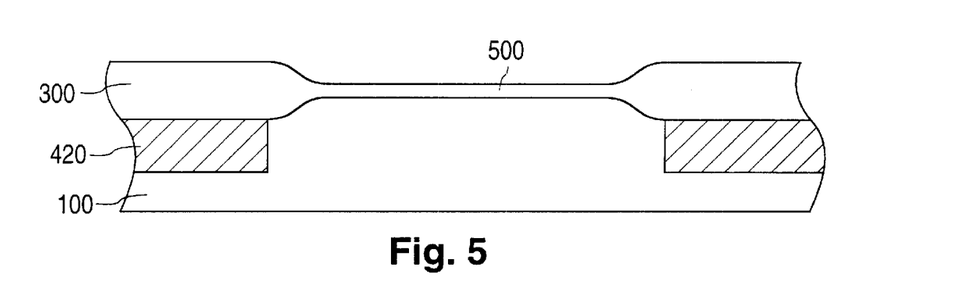
FIG. 5 is a cross-sectional view of a phase of a method in accordance with an embodiment of the present invention.

Thereafter, as depicted in FIG. 5, a gate oxide layer 500 is formed over channel region 120, as by thermal oxidation, to a thickness of about 300 Å to about 500 Å, preferably about 400 Å.

Figure 6A:
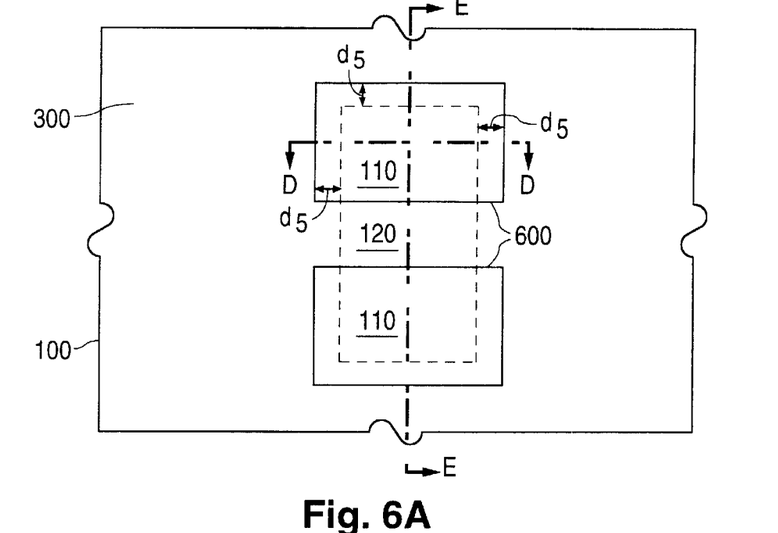
FIG. 6A is a top view of a phase of a method in accordance with an embodiment of the present invention.
Figure 6B:
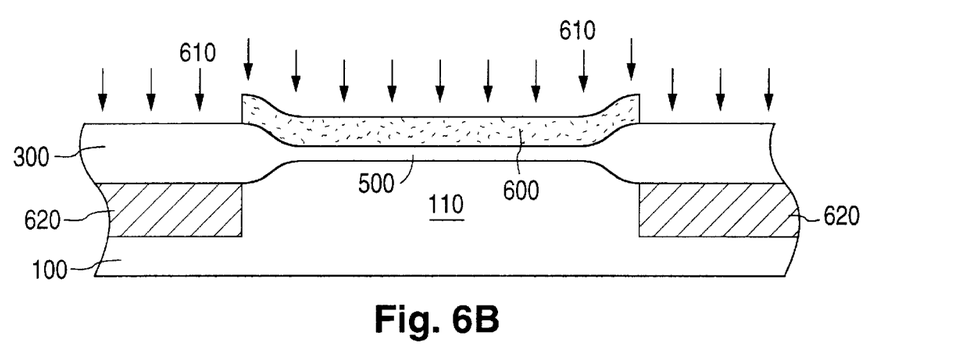
FIG. 6B is a cross-sectional view taken along the line D—D in FIG. 6A.
Figure 6C:
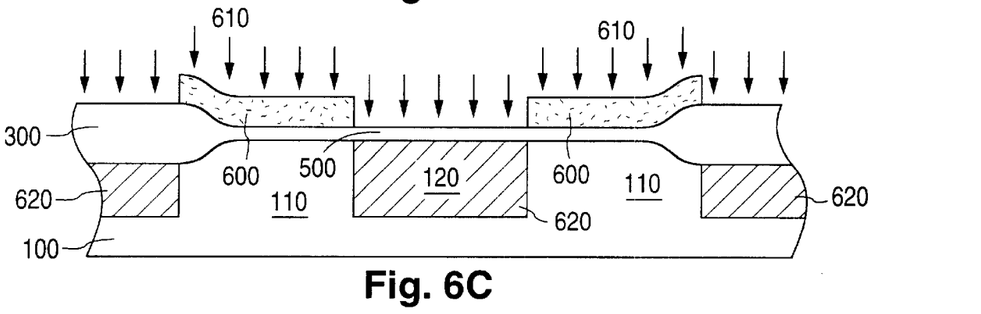
FIG. 6C is a cross-sectional view taken along the line E—E in FIG. 6A.

Next, referring to FIGS. 6A–6C, a photoresist threshold voltage implant blocking mask 600 is formed over each source/drain region 110, typically extending from the distal end and opposing sides of each source/drain region 110 onto field oxide 300 a distance $d_5$, about 0.5 $\mu$m to about 1.0 $\mu$m; e.g., about 0.5 $\mu$m. Impurities 610 are then implanted through field oxide 300 and channel region 120 to form the threshold adjust implant 620, such as boron at a dosage of about $0.8 \times 10^{12}$ atoms cm$^{-2}$ to about $2 \times 10^{12}$ atoms cm$^{-2}$ and at an energy of about 15 keV to about 30 keV, e.g., at a dosage of about $1.1 \times 10^{12}$ atoms cm$^{-2}$ and at an energy of about 15 keV. As discussed above, if only one of the pair of source/drain areas 110 is a high voltage junction, threshold voltage implant blocking mask 600 would be formed over the area 110 which is to handle high voltage, and not over the other source/drain area 110. Threshold adjust implant 620 controls the transistor's turn-on voltage. However, the transistor's gated diode breakdown voltage is raised since it is blocked from source/drain regions 110 by mask 600.

Figure 7:
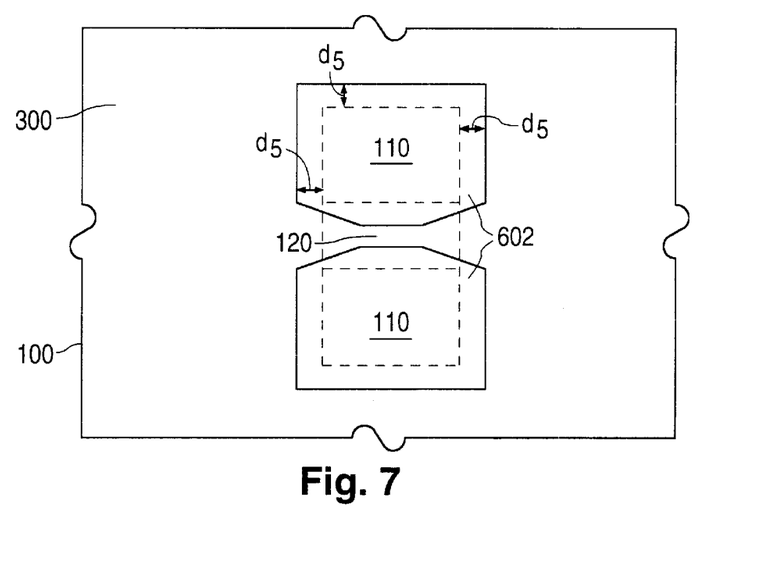
FIG. 7 is a top view of a phase of a method in accordance with another embodiment of the present invention.

FIG. 7 shows another embodiment of a photoresist threshold voltage implant blocking mask 602 formed over each source/drain region 110. As shown in FIG. 7, threshold voltage implant blocking mask 602 extends over channel region 120. Threshold voltage implant blocking mask 602 provides improved breakdown characteristics. However, use of threshold voltage implant blocking mask 602 may increase leakage.

Referring now to FIGS. 8 and 9A–9C, a gate 800 is formed over channel region 120, as by a polysilicon-based gate formation process, such as by depositing, masking and etching a composite layer 700 comprising a layer of polysilicon about 1200 Å thick, a layer of tungsten silicide about 1000 Å to about 2000 Å thick and a layer of silicon oxynitride about 1000 Å to about 2000 Å thick.

Figure 8:
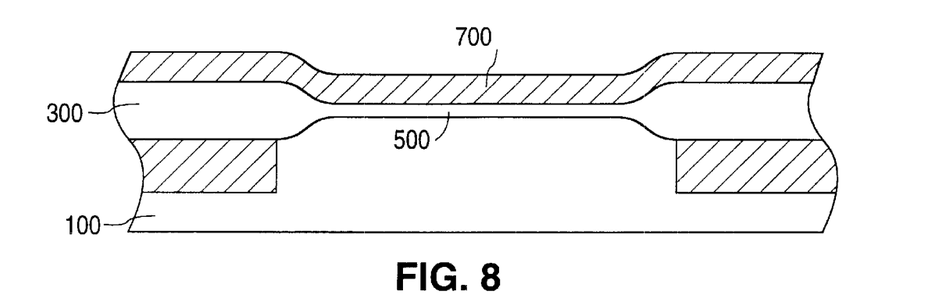
FIG. 8 is a cross-sectional view of a phase of a method in accordance with an embodiment of the present invention.
Figure 9A:
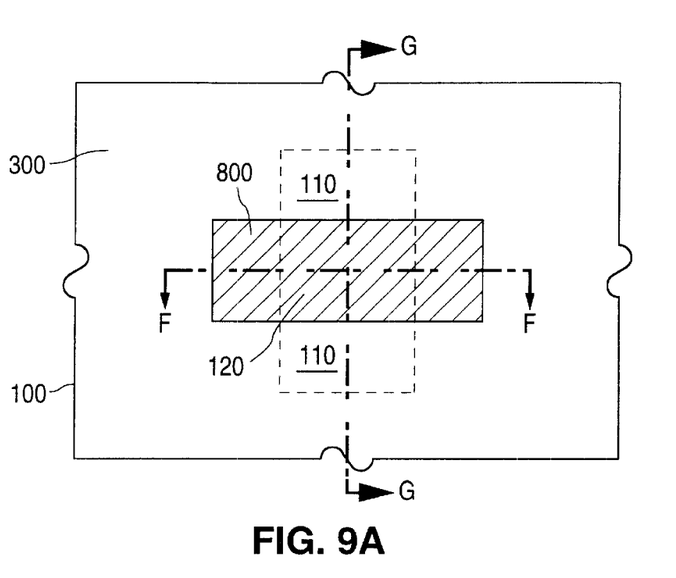
FIG. 9A is a top view of a phase of a method in accordance with an embodiment of the present invention.
Figure 9B:
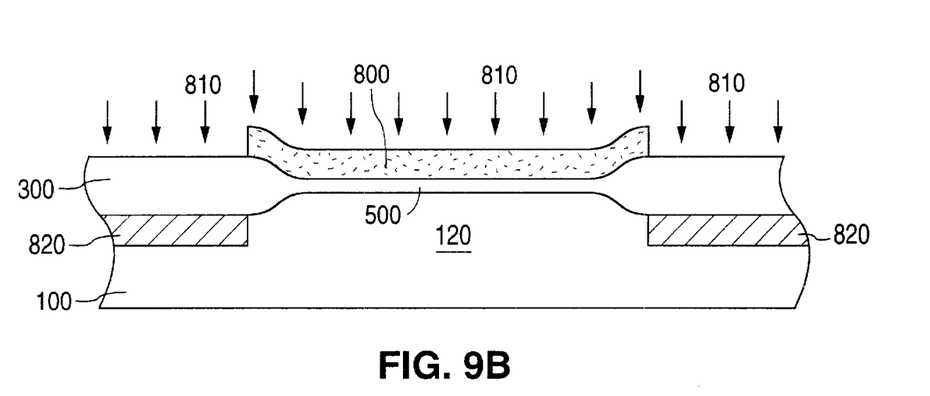
FIG. 9B is a cross-sectional view taken along the line F—F in FIG. 9A.
Figure 9C:
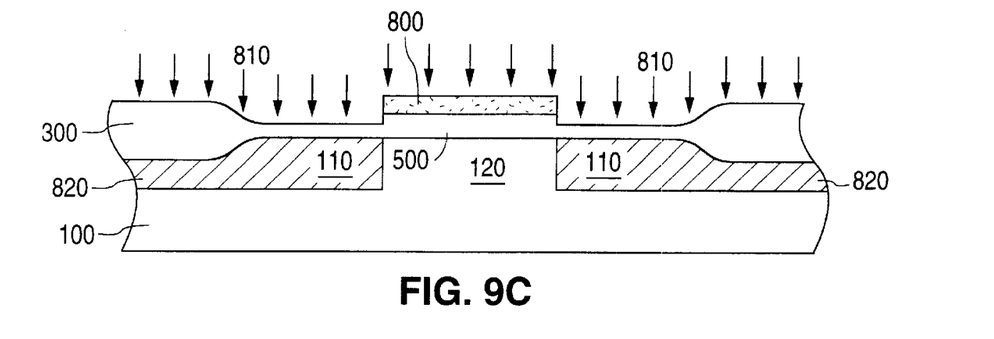
FIG. 9C is a cross-sectional view taken along the line G—G in FIG. 9A.

A blanket implant 810 is then performed, such as phosphorus at a dosage of about $1 \times 10^{12}$ atoms cm$^{-2}$ to about $5 \times 10^{12}$ atoms cm$^{-2}$ and at an energy of about 20 keV to about 60 keV, e.g., at a dosage of about $3 \times 10^{12}$ atoms cm$^2$ and at an energy of about 30 keV, to form a lightly doped junction implant 820 in source/drain areas 110. This implant replaces the LDD implant and heavy n+ implant of conventional transistors, raising the gated diode breakdown voltage of the transistor produced by the inventive method.

Figure 10A:
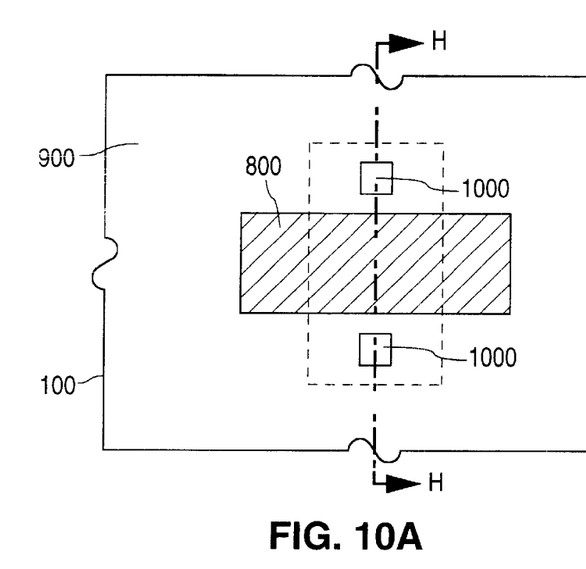
FIG. 10A is a top view of a phase of a method in accordance with an embodiment of the present invention.
Figure 10B:
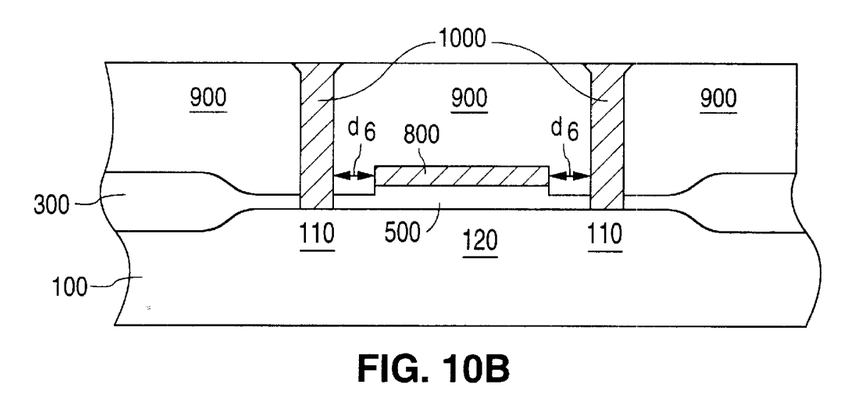
FIG. 10B is a cross-sectional view taken along the line H—H in FIG. 10A.

As depicted in FIGS. 10A–10B, after standard process steps are completed (e.g. implants for other transistors to be formed on substrate 100), a dielectric layer 900 is deposited and contacts 1000 are formed from an upper surface of dielectric layer 900 to source/drain regions 110, using conventional techniques. In forming to produce a transistor with a high gated diode breakdown voltage, it is desirable to maintain a low doping concentration under the transistor gate. Therefore, contacts 1000 are spaced apart a distance d6 of at least about 0.4 $\mu$m from the edge of gate 800, e.g., about 0.7 $\mu$m, so that a subsequently performed contact implant, which is typically done at a high dosage, does not diffuse excessively under gate 800.

The inventive method achieves a high gated diode breakdown voltage by masking the high voltage junctions (i.e., areas where source/drain regions 110 abut channel region 120) from field implant 410 with mask 400, masking source/drain regions 110 from threshold adjust implant 610 with mask 600, and employing a very lightly doped n-type implant 810 in lieu of conventional n+ and LDD implants. At the same time, the inventive methodology provides angled notches in field implant blocking mask 400 to form a field implant 420 a distance from the edges of the junctions that increases as the implant 420 extends towards the center of the channel region, thereby enabling the manufacture of a transistor which exhibits low leakage and high gated diode breakdown voltage. Furthermore, field implant blocking mask 400 extends over channel area 120, thereby producing a transistor with low body effect. The present invention is applicable to the manufacture of various types of high-voltage semiconductor devices, particularly high density semiconductor devices having a design rule of about 0.25 μm and under, e.g., about 0.18 μm and under.

The present invention can be practiced by employing conventional materials, methodology and equipment Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention. It is to be understood that the invention is capable of use in various other combinations and environments and is capable of changes or modifications within the scope of the inventive concept as expressed herein.

What is claimed is:

1. A method of manufacturing a semiconductor device, the method comprising:

providing a substrate having an active area, the active area comprising a first junction between a first source/drain region and a channel region and a second junction between a second source/drain region and the channel region, the first source/drain region and the second source/drain region separated by the channel region of a predetermined width, the channel region having opposing ends not abutting either of the source/drain regions;

providing a field implant blocking mask over the first source/drain region and extending over the channel region, the field implant blocking mask having a pair of angled notches at the opposing ends of the channel region, each angled notch extending towards the center of the channel region a predetermined distance from the opposing ends of the channel region to form the ends of the angled notches, each angled notch being angled with respect to the first junction; and implanting impurities to form a field implant region in the substrate.

2. The method according to claim 1, wherein the angled notches form a first distance between the first junction at the opposing ends of the channel region and a second distance between the first junction and the ends of the angled notches.

3. The method according to claim 1, comprising isolating the active area by providing a photoresist mask corresponding to the active area on the main surface of the substrate and forming a field oxide surrounding the active area.

4. The method according to claim 1, wherein the predetermined distance of the angled notches in the field implant blocking mask is about 0.1 μm to about 0.4 μm.

5. The method according to claim 4, wherein the predetermined distance is about 0.21 μm.

6. The method according to claim 3, wherein the field implant blocking mask extends from the distal end of the first source/drain region a first distance onto the field oxide and extends from opposing sides of the first source/drain region a second distance from each opposing side onto the field oxide.

7. The method according to claim 6, wherein the first distance and the second distance are about 0.5 μm to about 1.0 μm.

8. The method according to claim 7, wherein the first distance and the second distance are about 0.8 μm.

9. The method according to claim 1, comprising providing the field implant blocking mask over the second source/drain area wherein each angled notch is angled with respect to the second junction.

10. The method according to claim 1, further comprising:

forming a gate oxide layer over the channel region;

providing a threshold voltage implant blocking mask over the first source/drain region and partially over the channel region; and implanting impurities to form a threshold adjust implant in the substrate.

* * * * *